United States Patent
Kundur Subramaniyan et al.

(10) Patent No.: US 12,196,793 B2
(45) Date of Patent: Jan. 14, 2025

(54) DERIVING A CAPACITANCE-RATIO INFORMATION, DEVICE AND METHOD

(71) Applicant: NXP B.V., Eindhoven (NL)

(72) Inventors: Harish Kundur Subramaniyan, Eindhoven (NL); Erwin Johannes Gerardus Janssen, Meijel (NL); Xi Zhang, Eindhoven (NL)

(73) Assignee: NXP B.V., Eindhoven (NL)

( * ) Notice: Subject to any disclaimer, the term of this patent is extended or adjusted under 35 U.S.C. 154(b) by 296 days.

(21) Appl. No.: 18/047,843

(22) Filed: Oct. 19, 2022

(65) Prior Publication Data

US 2023/0176103 A1  Jun. 8, 2023

(30) Foreign Application Priority Data

Dec. 6, 2021 (EP) .................................. 21212508

(51) Int. Cl.
*G01R 27/26* (2006.01)
*G01R 15/04* (2006.01)
(Continued)

(52) U.S. Cl.
CPC ......... *G01R 27/2605* (2013.01); *G01R 15/04* (2013.01); *G01R 27/2611* (2013.01);
(Continued)

(58) Field of Classification Search
CPC ............ G01R 27/2605; G01R 27/2611; G01R 27/2688; G01R 15/06; G01R 15/04;
(Continued)

(56) References Cited

U.S. PATENT DOCUMENTS 7,612,703 B2 * 11/2009 Chen .................... H03M 1/1057
341/172
2011/0204899 A1    8/2011 Klapper et al.
(Continued)

FOREIGN PATENT DOCUMENTS

EP     2993480 A1    3/2016

OTHER PUBLICATIONS

Cao, Y., "CMOS circuits for on-chip capacitance ratio testing or sensor readout," Proceedings of ISCAS'95—International Symposium on Circuits and Systems, pp. 1848-1851, vol. 3, Apr. 30,-May 3, 1995.
(Continued)

*Primary Examiner* — Amy He

(57) ABSTRACT

It is described an attenuation measurement device (100), comprising:
i) a detector unit (110) having a coupling capacitance (120), and an input capacitance (130), wherein the detector unit (110) is configured to produce a detector output signal (112a,b) in reply to an input signal received at the coupling capacitance (120) and/or at the input capacitance (130);
ii) a test unit (140), coupled to the detector unit (110), and configured to provide a test signal (141) with at least one known signal property as a first input signal to the coupling capacitance (120);
iii) a calibration unit (150), coupled to the detector unit (110), and configured to provide a calibration signal (151) as a second input signal to the input capacitance (130); and
iv) a control unit configured to
a) determine a first detector output signal (112a) produced by the detector unit (110) in response to the test signal (141),
(Continued)

b) identify a specific calibration signal (151) that yields a second detector output signal (112*b*) that is comparable to the first detector output signal (112*a*), and c) derive a capacitance-indicative information based on the identified specific calibration signal (151).

20 Claims, 2 Drawing Sheets

(51) Int. Cl.
*H04B 17/11* (2015.01)
*H04B 17/15* (2015.01)
*H04B 17/21* (2015.01)
*H04B 17/29* (2015.01)

(52) U.S. Cl.
CPC ......... *G01R 27/2688* (2013.01); *H04B 17/11* (2015.01); *H04B 17/15* (2015.01); *H04B 17/21* (2015.01); *H04B 17/29* (2015.01)

(58) Field of Classification Search
CPC ........ H04B 17/15; H04B 17/11; H04B 17/21; H04B 17/29
See application file for complete search history.

(56) References Cited

U.S. PATENT DOCUMENTS

2013/0234726 A1 9/2013 Hobelsberger
2013/0241599 A1* 9/2013 Soenen ................. H03K 5/125
327/65

OTHER PUBLICATIONS

Ning, Z., "A Simple and Accurate Capacitance Ratio Measurement Technique for Integrated Circuit Capacitor Arrays", Proceedings of the 2005 International Conference on Microelectronic Test Structures, vol. 18, Apr. 4-7, 2005.

* cited by examiner

DERIVING A CAPACITANCE-RATIO INFORMATION, DEVICE AND METHOD

CROSS-REFERENCE TO RELATED APPLICATIONS

This application claims the priority under 35 U.S.C. § 119 of European Patent application no. 21212508.2, filed on 6 Dec. 2021, the contents of which are incorporated by reference herein.

TECHNICAL FIELD

The present disclosure relates to an attenuation measurement device with a detector unit, a test unit, and a calibration unit. Further, the present disclosure relates to a method of deriving a capacitance-indicative information (ratio/attenuation) with respect to the attenuation measurement device. Thus, the present disclosure may refer to the technical field of signal level-detection which could be used in transceivers.

TECHNICAL BACKGROUND

In signal transceivers, radio frequency (in particular high frequency, and/or mmWave) signals are detected (measured) by detectors such as peak/rms detectors. Thereby, a control can be achieved over the signal power level. For example, in power amplifiers (in a transmitter), the output power needs to be controlled to meet emission standards, to ensure reliable operation of the devices (for example, transistors) during their operational lifetime, and to reduce power consumption. In order to achieve these needs, capacitive coupling (or attenuation) is typically used to couple the transmitted signals, that should be measured (for example to a signal detector).

Capacitive coupling is generally applied, for example, to reduce the signals to be detected to levels at which the detectors can operate the best, to bias the detector, etc. However, the capacitive couplers/attenuators may introduce uncertainties in the detected signal levels, for example due to variation in the capacitance ratios (e.g. a ratio between a capacitive coupling and a capacitive detector). A reason for these uncertainties may be found in the process variations of the integrated circuit technology process in which the detector circuitry is implemented.

Further, the types of the capacitance used for coupling the signal and for actually detecting the signal are normally different. Conventionally, capacitive ratios may be determined from similar types of capacitors, using e.g. simple linear alternating current (AC) transfer and nulling techniques. In one example, an AC measurement, using a sensitive lock-in amplifier, is applied. Thus, it may still be considered a challenge to calibrate the capacitances of different detector types.

OBJECT AND SUMMARY OF THE DISCLOSURE

There may be a need to calibrate a capacitance ratio in an efficient and robust manner.

An attenuation measurement device and a method of deriving a capacitance ratio according to the independent claims are provided. Exemplary embodiments are described by the dependent claims.

According to an aspect of the present disclosure, there is described an attenuation measurement device, comprising:

i) a detector unit having a coupling capacitance (in particular arranged between a test unit and an input of the detector unit), and an input capacitance (in particular at the input of the detector unit),
wherein the (non-linear) detector unit is configured to produce a detector output signal in response to an input signal received at the coupling capacitance and/or at the input capacitance (preferably, comparable signal levels lead to comparable output signals, independent of the reception being at the coupling capacitance or the input capacitance);
ii) a test unit, coupled to the detector unit (in particular via the coupling capacitance), and configured to provide a test signal with at least one known signal property (e.g. signal magnitude, power level, etc.) as a first input signal to (through) the coupling capacitance (to the detector unit);
iii) a calibration unit, coupled to the detector unit (in particular between the coupling capacitance and the input capacitance), and configured to provide (at least one, in particular a plurality of) a calibration signal as a second input signal to the input capacitance (of the detector unit); and
iv) a control unit (can be part of the detector unit, but can also be arranged in another unit of the device or even operate remote) configured to
a) determine a first detector output signal produced by the detector unit in response to the test signal (received from the test unit),
b) identify (search for) a specific calibration signal (from the calibration unit) that yields a second detector output signal that is comparable to the first detector output signal, and
c) derive a capacitance-indicative information (e.g. a capacitance ratio/attenuation) based on the identified specific calibration signal (and the known test signal).

According to a further aspect of the present disclosure, there is described a method of operating an attenuation measurement device (as described above) having a detector unit with a coupling capacitance and an input capacitance, the method comprising:

i) providing a test signal with at least one known signal property as a first input signal to the coupling capacitance (whereby the calibration signal/unit is isolated from the detector unit);
ii) determining a first detector output signal produced by the detector unit in response to the (first input) test signal;
iii) providing a calibration signal as a second input signal to the input capacitance (whereby the test signal/unit is isolated from the detector unit) and (thereby) identifying a specific calibration signal to the input capacitance that yields a second detector output signal that is comparable to the first detector output signal; and
iv) deriving a capacitance-indicative information based on the identified specific calibration signal.

In the context of the present document, the term "attenuation measurement device" (in particular signal detection device) may refer to any device that is configured to receive a signal input and to produce an output associated with the input signal. In particular, a detector device may comprise a detector unit as the actual detector (for example a peak detector or an rms detector) that receives the signal and produces the corresponding output. To fulfill these objectives, the detector unit may comprise a coupling capacitance and an input capacitance. The coupling capacitance may be arranged separated from the actual detection means (e.g. the input capacitance), but may be considered as part of the detector unit. The coupling capacitance may receive an incoming (HF) signal and attenuate said signal. The attenuated signal may then be forwarded to the input capacitance, which may represent the actual detection stage. In a basic embodiment, a capacitance may be realized by a capacitor. In a more sophisticated embodiment, a capacitance may be implemented by two CMOS transistors (see e.g. FIG. 2). The implementation may be for example single-ended, differential, or multi-phase.

Further, the attenuation measurement device can comprise a test unit and a calibration unit, each of which is coupled to its detector unit. In an embodiment, the test unit and the calibration unit are coupled to the detector unit, so that RF signals can still be received by the detector unit. In another embodiment, the described attenuation measurement device may be an (exact) copy of an RF signal-receiving twin (or a scaled replica of a attenuation measurement/signal detector device) and is merely configured to be used as a calibration device for the RF signal-receiving twin (or a scaled replica). Both devices may be implemented on the same chip.

In the context of the present document, the term "test signal" may particularly refer to a signal provided to a coupling (attenuation) capacitance of a detector, whereby at least one signal property of the test signal is known. The signal property may for example comprise at least one of the following: signal (power/voltage) level, signal magnitude, signal wave-shape (digital, sine-wave, etc.). The term "test unit" may refer to a hardware and/or software that is configured to produce such a test signal.

In the context of the present document, the term "calibration signal" may particularly refer to a signal that is provided to an input capacitance of a detector. The calibration signal may be essentially similar to the test signal but can also be different. In an embodiment, a plurality of calibration signals are provided to search for one specific calibration signal out of the plurality of calibration signals. The specific calibration signal may yield a comparable detector output signal as the test signal. Thereby, a capacitance-indicative information (in particular capacitance ratio/attenuation) may be derived that can be used for calibration of the detector device. The term "calibration unit" may refer to a hardware and/or software that is configured to provide such a calibration signal. Further, the calibration unit may be configured to enable an identification (e.g. by sweeping) of the specific calibration signal that is searched for.

In the context of the present document, the term "comparable" may particularly refer to the circumstance, that the detector output signals for the known test signal (at the coupling capacitance) and for the specific calibration signal (at the input capacitance) comprise comparable properties. In an embodiment, the output signals can be essentially (only unavoidable differences) similar, or even similar. In another embodiment, the output signals are on the same level or are scaled with respect to each other. In a specific embodiment (see FIG. 2), the detector output voltages due to the input test signal and due to the specific calibration signal should be (essentially) equal. The skilled person will understand that there are different possibilities to implement such comparable output signals. Nevertheless, the skilled person may further understand that the comparability should be implemented such that an efficient and robust calibration of the detector device is thereby enabled. Further, "comparable" detector input signals may refer to signals having the same or approximately the same rms values, peak values, etc. of the detector, depending on the type of the detector (unit).

In the context of the present document, the term "control unit" may refer to any hardware and/or software configured to perform and/or trigger the described steps of determining, identifying, deriving (and calibrating). There are many different manners in which the control unit can be implemented. The control unit may be a single unit or a plurality of control subunits. There may be one control unit arranged in the detector unit or each unit may comprise its own control unit. For example, a part of the control unit identifies in the calibration unit, while another part derives in the detector unit. Thus, the control unit(s) can be part of the detector unit, but can also be arranged in another unit of the device or even operate remotely.

According to an exemplary embodiment, the present disclosure may be based on the idea that an efficient and robust calibration of a detector device is enabled, when a specific calibration signal applied to the detector unit input is identified, that yields a comparable detector output as a known test signal provided to a detector coupling capacitance. Based on the known test signal and the identified specific calibration signal, capacitance-indicative information, such as a coupling/input capacitance ratio and/or a coupling capacitance attenuation, may be derived that can be further used to calibrate the detector device in an efficient and robust manner.

A coupling capacitance (capacitive attenuator) may be useful to couple e.g. RF/mmWave signals (e.g. in the field of (car-related) radar) to signal detectors (in particular to the input capacitance). It may be important to know the capacitance ratio to know the signal level at the attenuator input, since the capacitance ratio may be sensitive to process variations as the two capacitances could be different types. The present disclosure describes a technique for obtaining the information based on which calibration is enabled by using (e.g. non-linear) properties of the detector unit.

DESCRIPTION OF EXEMPLARY
EMBODIMENTS

In the following, further exemplary embodiments of the device and the method will be explained.

In an embodiment of the present disclosure, the calibration signal is a direct current (DC) calibration signal. Additionally or alternatively, the detector output signal is a DC detector output signal. Using DC instead of AC may save costs and may be more straightforward to implement. In an embodiment, only DC measurements are used to estimate the attenuation and hence the capacitance ratio. A non-linear and broadband property of the detector itself may be used hereby to estimate the capacitance ratio (using comparison/nulling technique with DC measurements).

In a further embodiment of the present disclosure, the capacitance-indicative information is derived exclusively based on DC measurements (of the output from the detector unit). Thereby, implementation, testing and energy costs may be saved, while the efficiency is not decreased and accuracy of capacitance indicative information is improved. The detector unit receives the test signal and the calibration signal as input signals and produces respective detector output signals. Hereby, both output signals (as responses to the test signal and the calibration signal) of the detector unit may be DC signals. In some implementations, there may be alternating current (AC) signals present during the detector input signal generation etc. However, the final (e.g. calibration) signal that is provided to the detector unit as an input signal is then a DC signal in this embodiment.

In a further embodiment of the present disclosure, the capacitance-indicative information comprises a capacitive ratio between the coupling capacitance and the input capacitance. In a further embodiment of the present disclosure, the capacitance-indicative information comprises a capacitive attenuation with respect to the coupling capacitance. Based on this information, the detector device may be calibrated accurately.

In a further embodiment of the present disclosure, identifying (searching for) the specific calibration signal comprises sweeping over a plurality of calibration signals. Thereby, the specific calibration signal may be found in a fast and reliable manner.

In an embodiment, the calibration unit further comprises a digital-to-analog (D/A) converter, configured to enable the sweep over the plurality of calibration signals (see the implementation in FIG. 2). Here, the DC signal is generated using the digital-to-analog converter by sweeping its digital input codes.

In a further embodiment, the device comprises a polarity switch unit, configured to switch the polarity of at least one calibration signal. Thereby, a more reliable derivation of the capacitance-indicative information may be achieved.

In a further embodiment of the present disclosure, the detector is a non-linear detector, in particular it is inherent to the detector to produce comparable detector output signals in response to comparable input signals, respectively, independent of receiving the said input signals at the coupling capacitance or the input capacitance. Such a configuration of the detector may enable the calibration based on the specific calibration signal that induces a comparable detector output as the known test signal.

The disclosure may use the property of capacitive attenuators and detectors that their attenuation and response are quite broadband, respectively. The detector is typically a non-linear device which produces a (DC) response to an RF signal depending on its signal level. Due to its broadband nature, the detector produces the same (DC) output to an RF signal as a (DC) signal at the same level in an embodiment.

In a further embodiment of the present disclosure, the detector is configured to receive and detect a high frequency signal. There may be a need to attenuate such an HF signal, for which purpose the coupling capacitance may be necessary. The detector may be implemented as a peak detector and/or rms detector.

In a further embodiment of the present disclosure, providing the test signal comprises providing a clock signal. Thereby, the test signal may be provided in a reliable and cost-efficient manner. The clock signal level is well known, as it switches between the supply (vdd) and ground (vss) levels. The clock signal is sufficiently low frequent so that the transition times may be neglected compared to the rest of the clock period. Under this condition, the clock signal's rms/peak levels are known, i.e. vdd-vss, which may be measured or controlled easily. In one specific embodiment, the known test signal is a clock signal applied using CMOS inverters.

In a further embodiment of the present disclosure, the control unit is further configured to determine a test unit supply voltage, when the first detector output signal is produced in response to the test signal. Hereby, deriving the capacitance-indicative information is further based on the determined test unit supply voltage. The supply voltage of the test unit or its scaled version may be measured separately by configuring the control unit. This supply voltage vdd may then be an important parameter (specifically, it denotes the rms or peak level of the input test signal), when deriving the capacitance-indicative information.

In a specific embodiment, the capacitive attenuation (capacitance-indicative information) is measured as follows: i) A D/A-converter voltage Vdac1 is measured when the detector unit output is comparable (or same) to its response to the test signal (clock) being applied. ii) Similarly, the step is repeated with the polarity switch reversed and a voltage Vdac2 is measured. The average Vdac=(Vdac1+Vdac2)/2 is noted. The capacitive attenuation estimate is given by: Atten (dB)=20* log 10 (vdd/Vdac).

In a further embodiment of the present disclosure, the coupling capacitance is coupled to the input capacitance, and the coupling capacitance is configured to provide an attenuated signal to the input capacitance. Thus, an low loss and broadband attenuation is achieved, while the capacitance ratio may be accurately measured.

In a further embodiment of the present disclosure, the input capacitance is implemented with at least two transistors, in particular two CMOS transistors.

In a further embodiment of the present disclosure, the method further comprises calibrating the detector based on the capacitance-indicative information.

In a further embodiment of the present disclosure, the method applies DC measurements, in particular exclusively DC measurements (within the detector and/or of the output from the detector unit), to derive the capacitance-indicative information.

BRIEF DESCRIPTION OF THE DRAWINGS

The illustrations in the drawings are schematic. In different drawings, similar or identical elements are provided with the same reference signs.

DETAILED DESCRIPTION OF THE DRAWINGS

Figure 1:
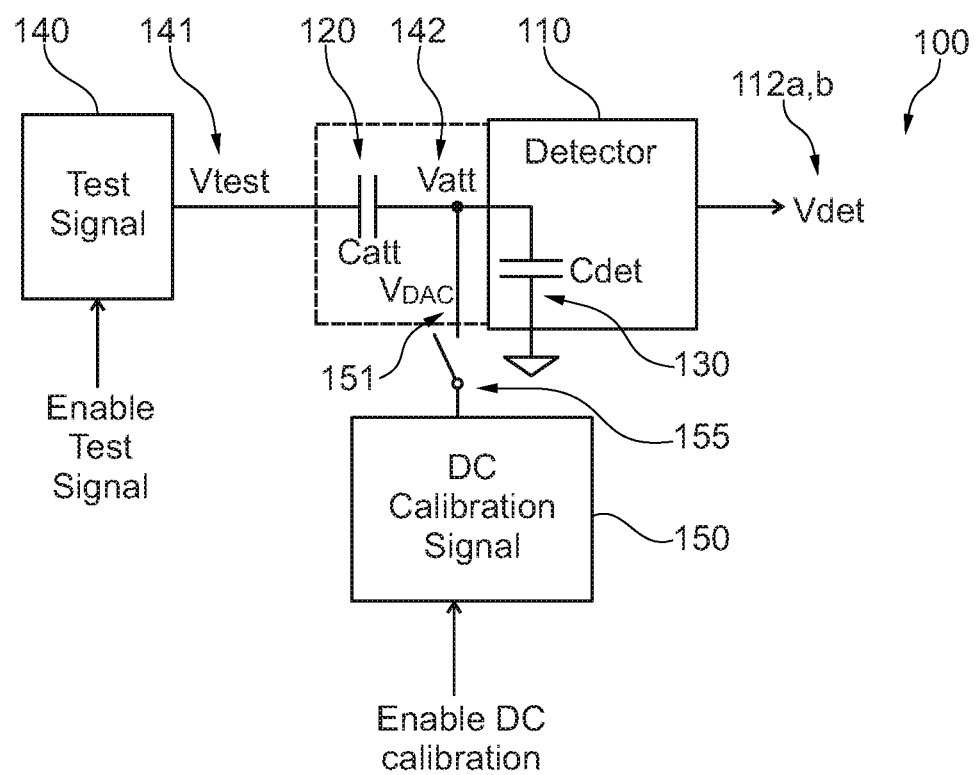
FIG. 1 illustrates an attenuation measurement device according to an exemplary embodiment of the present disclosure.

Before referring to the drawings, exemplary embodiments will be described in further detail, some basic considerations will be summarized based on which exemplary embodiments of the present disclosure have been developed.

According to exemplary embodiments of the present disclosure, the following steps are performed:
  i) first, a test signal, whose level is well known, is applied at the input of the attenuator (coupling capacitance) and the DC response of the detector is measured,
  ii) approximately, the same output response of the detector is evoked after removing the test signal and instead applying a DC calibration signal at the detectors bias inputs and the corresponding DC calibration signal is measured. Hereby, a DC signal is applied directly to the detector's input. The DC signal is varied such that the output of the detector is approximately same as in the first measurement. This implies that the RF signal level (rms or peak) at the detector input in the first measurement was same as the DC signal level applied in the second measurement,
  iii) the capacitive ratio can be indirectly determined by using the known test signal strength and the measured DC calibration signal levels. If the test signal is chosen well, only DC measurements can be used to estimate the capacitance ratio. Thus, the RF signal levels at the input and output of the capacitive attenuator has been estimated using two DC measurements. The capacitive attenuator and hence the capacitance ratio can be estimated.

Thus, the present disclosure proposes a technique to measure the capacitive attenuation caused by the coupling capacitance and the input capacitance of the detector.

FIG. 1 illustrates an attenuation measurement device 100 for capacitance ratio measurement according to an exemplary embodiment. The device 100 comprises a detector unit 110 having a coupling capacitance 120 (Catt) and an input capacitance 130 (Cdet). The detector unit 110 is configured to produce a detector output signal 112a,b in response to an input signal received at the coupling capacitance 120 and/or at the input capacitance 130.

The coupling capacitance 120 is arranged outside of the actual detecting means (yet considered as part of the detector unit 110) and receives an incoming RF signal as an input signal, whereby the incoming signal becomes attenuated by the coupling capacitance 120. The input capacitance 130 is arranged within the actual detecting means of the detector unit 110 and is connected to the coupling capacitance 120.

The attenuation measurement device 100 comprises a test unit 140, coupled to the detector unit 110, and configured to provide a test signal 141 with at least one known signal property (e.g. signal magnitude) as a first input signal to the coupling capacitance 120. Further, the attenuation measurement device 100 comprises a calibration unit 150, coupled to the detector 110, and configured to provide a calibration signal 151 as a second input signal to the input capacitance 130. In this specific embodiment, the attenuation measurement device 100 is a copy for calibration purposes of an actual detector device (e.g. on the same chip). Thus, the capacitances 120, 130 are connected only to the test unit 140 and the calibration unit 150, respectively. A switch 155 is provided to enable a decoupling of the calibration unit 150 and the capacitances 120, 130, so that the test signal 141 and the calibration signal 151 do not interfere.

A control unit is not shown in this example, but the control unit can be arranged anywhere in the device 100 or even remote. Further, the functionalities of the control unit can be split over the units 110, 140, 150 of the device 100. After a test signal 141 is provided to the coupling capacitance 120 (an attenuated signal 142 is further directed to the input capacitance 130) as a first input signal, a first detector output signal 112a (produced by the detector unit 110 in response to the test signal 141/142) is detected. In other words, a clock is enabled, the calibration current is disabled, and the output of the detector 112a (Vdet) is measured and the supply voltage 111 of the inverter (vdd) is also measured. Then, it is swept over a plurality of calibration signals 151 to identify a specific calibration signal that yields a second detector output signal 112b that is comparable to the first detector output signal 112a. In other words, the clock is disabled, a D/A-converter code is swept such that approximately the same output value 112b (Vdet) as before is reached at the output of the detector unit 110. Based on these measurements, preferably only using DC only, a capacitance-indicative information based on the identified specific calibration signal 151 and the known test signal 141 can be derived.

Figure 2:
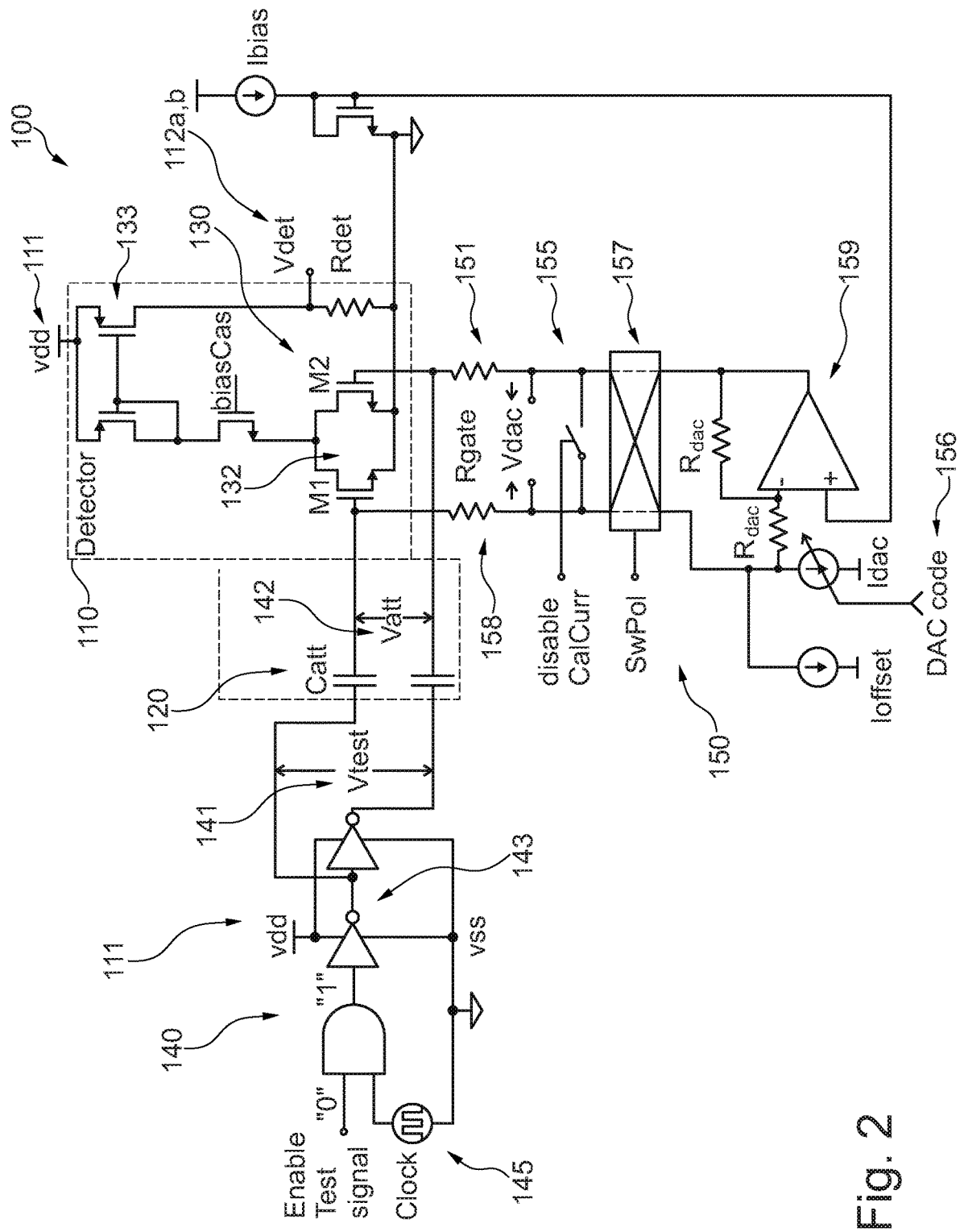
FIG. 2 illustrates an attenuation measurement device according to a further exemplary embodiment of the present disclosure.

FIG. 2 illustrates a detector device 100 for signal detection according to another exemplary embodiment. While FIG. 1 shows a general embodiment, FIG. 2 illustrates a specific implementation in detail, wherein the attenuation measurement device 100 is realized in a differential CMOS design.

The detector means 110 are hereby implemented by using the squaring nature of MOS transistors. In particular, two transistors 132, M1 and M2, form the input capacitance 130. The transistor (squarer) output current is mirrored by a current mirror 133 and passed through a detector resistor (Rdet) to produce the detector output signals 112a,b (Vdet).

The test signal 145 is a clock which is made differential using inverters 143 and is then applied to the coupling capacitance 120 (coupling capacitors Catt) and the gate capacitance of the transistors 132 (M1, M2) that form the input capacitance 130. The calibration signal 151 (Vdac) (and a gate bias) are applied to the detector 110 using further (bias) resistors 158 (Rgate).

The calibration unit 130 comprises a digital-to-analog converter 156 (not shown in detail) and an operation amplifier. A polarity switch 157 is used to improve the accuracy of the specific calibration signal identification by removing offsets in the operational amplifier 159 and mismatches in the feedback around the operational amplifier 159.

REFERENCE NUMERALS

100 Attenuation measurement device
110 Detector unit
111 Supply voltage
112a First detector output signal
112b Second detector output signal
120 Coupling capacitance
130 Input capacitance
132 Transistors
133 Current mirror
140 Test signal unit
141 Test signal
142 Attenuated signal
143 Inverter
145 Clock signal unit
150 Calibration signal unit
151 DC calibration signal, specific DC calibration signal
155 Calibration signal switch
156 D/A converter
157 Polarity switch
158 Bias resistor
159 Operational amplifier

The invention claimed is:

1. An attenuation measurement device, comprising:
a detector unit having
 a coupling capacitance, and
 an input capacitance,
 wherein the detector is configured to produce a detector output signal in response to an input signal received at at least one of the coupling capacitance and the input capacitance;
a test unit, coupled to the detector unit, and configured to provide a test signal with at least one known signal property as a first input signal to the coupling capacitance;
a calibration unit, coupled to the detector unit, and configured to provide a calibration signal as a second input signal to the input capacitance; and
a control unit configured to
determine a first detector output signal produced by the detector in response to the test signal, identify a specific calibration signal that yields a second detector output signal that is comparable to the first detector output signal, and derive a capacitance-indicative information based on the identified specific calibration signal.

2. The attenuation measurement device according to claim 1, comprising at least one of the following features:

wherein the calibration signal is a direct current, DC, calibration signal;

wherein the detector output signal is a DC detector output signal.

3. The attenuation measurement device according to claim 2, wherein the capacitance-indicative information is derived exclusively based by DC measurements with respect to the detector unit.

4. The attenuation measurement device according to claim 1, comprising at least one of the following features:

wherein the capacitance-indicative information comprises a capacitive ratio between the coupling capacitance and the input capacitance;

wherein the capacitance-indicative information comprises a capacitive attenuation with respect to the coupling capacitance.

5. The attenuation measurement device according to claim 1, wherein identifying the specific calibration signal comprises sweeping over a plurality of calibration signals.

6. The attenuation measurement device according to claim 5, wherein the calibration unit further comprises at least one of the following:

a digital-to-analog converter, configured to sweep over the plurality of calibration signals;

a polarity switch unit, configured to switch the polarity of at least one calibration signal.

7. The attenuation measurement device according to claim 1, wherein the detector unit comprises a non-linear detector, and wherein it is inherent to the detector unit to produce comparable detector output signals in response to comparable input signals, respectively, independent of receiving said input signals at the coupling capacitance or the input capacitance.

8. The attenuation measurement device according to claim 1, comprising at least one of the following features:

wherein the detector unit is configured to receive and detect a high frequency signal;

wherein the detector unit comprises a peak detector;

wherein the detector unit comprises an rms detector.

9. The attenuation measurement device according to claim 1, wherein providing the test signal comprises providing a clock signal.

10. The attenuation measurement device according to claim 1, wherein the control unit is further configured to:

determine a test unit supply voltage, when the first detector output signal is produced in response to the test signal; and wherein deriving the capacitance-indicative information is further based on the determined test unit supply voltage.

11. The attenuation measurement device according to claim 1, wherein the coupling capacitance is coupled to the input capacitance, and wherein the coupling capacitance is configured to provide an attenuated signal to the input capacitance.

12. The attenuation measurement device according to claim 1, wherein the input capacitance is implemented with at least two transistors.

13. A method of operating an attenuation measurement device having a detector unit with a coupling capacitance and an input capacitance, the method comprising:

providing a test signal with at least one known signal property as a first input signal to the coupling capacitance;

determining a first detector output signal produced by the detector unit in response to the test signal;

providing a calibration signal as a second input signal to the input capacitance and identifying a specific calibration signal to the input capacitance that yields a second detector output signal that is comparable to the first detector output signal; and deriving a capacitance-indicative information based on the identified specific calibration signal.

14. The method according to claim 13, further comprising:

calibrating the detector unit based on the capacitance-indicative information.

15. The method according to claim 13, wherein the method applies DC measurements with respect to the detector unit to derive the capacitance-indicative information.

16. The method according to claim 13, wherein the capacitance-indicative information comprises a capacitive ratio between the coupling capacitance and the input capacitance.

17. The method according to claim 13, wherein identifying the specific calibration signal comprises sweeping over a plurality of calibration signals.

18. The method according to claim 13, further comprising determining a test unit supply voltage when the first detector output signal is produced in response to the test signal.

19. The method according to claim 18, wherein deriving the capacitance-indicative information is further based on the determined test unit supply voltage.

20. The method according to claim 13, further comprising:

coupling the coupling capacitance to the input capacitance; and providing an attenuated signal to the input capacitance by way of the coupling capacitance.

* * * * *